United States Patent
Dalmer et al.

(10) Patent No.: US 9,960,057 B2
(45) Date of Patent: May 1, 2018

(54) DEVICE FOR MEASURING THE DISTRIBUTION OR IMPULSE OF A SERIES OF DROPLETS

(71) Applicant: LAM RESEARCH AG, Villach (AT)

(72) Inventors: Michael Dalmer, Villach (AT); Alexander Lippert, Villach (AT); Philipp Engesser, Villach (AT); Rainer Obweger, Villach (AT)

(73) Assignee: LAM RESEARCH AG, Villach (AT)

(*) Notice: Subject to any disclaimer, the term of this patent is extended or adjusted under 35 U.S.C. 154(b) by 534 days.

(21) Appl. No.: 14/575,692

(22) Filed: Dec. 18, 2014

(65) Prior Publication Data

US 2016/0181129 A1  Jun. 23, 2016

(51) Int. Cl.
*H01L 21/67* (2006.01)
*G01L 5/00* (2006.01)

(52) U.S. Cl.
CPC .... *H01L 21/67051* (2013.01); *H01L 21/6708* (2013.01); *H01L 21/67253* (2013.01); *H01L 21/67288* (2013.01)

(58) Field of Classification Search
CPC .......... H01L 21/67051; H01L 21/6708; H01L 21/67253; H01L 21/67288
See application file for complete search history.

(56) References Cited

U.S. PATENT DOCUMENTS

| 4,835,435 A * | 5/1989 | Yeung | B41J 2/125 310/323.21 |
|---|---|---|---|
| 5,422,664 A * | 6/1995 | Stephany | B41J 2/04558 347/14 |
| 8,691,022 B1 | 4/2014 | Holsteyns et al. | |
| 2002/0096577 A1* | 7/2002 | Takeuchi | B01L 3/0268 239/101 |
| 2004/0135830 A1* | 7/2004 | Kamiyama | B41J 2/125 347/9 |
| 2008/0204490 A1* | 8/2008 | Kojima | B41J 2/14209 347/9 |
| 2009/0147038 A1* | 6/2009 | Tsukada | B41J 2/16579 347/14 |

* cited by examiner

Primary Examiner — Michael Barr
Assistant Examiner — Benjamin L Osterhout

(57) ABSTRACT

A device for measuring the distribution and/or impulse of a series of droplets comprises a piezoelectric sensor positioned relative to a source of droplets such that each of a plurality of droplets contacts the piezoelectric sensor in succession, thereby to generate an electrical signal. Logic circuitry is configured to calculate one or more frequencies from the electrical signal.

3 Claims, 3 Drawing Sheets

DEVICE FOR MEASURING THE DISTRIBUTION OR IMPULSE OF A SERIES OF DROPLETS

BACKGROUND OF THE INVENTION

The present invention relates to a device for measuring the distribution and/or impulse of a series of droplets, such as a stream of monodisperse droplets dispensed from a process liquid dispenser during processing of a semiconductor wafer.

The trend toward ever smaller semiconductor device structures formed on semiconductor wafers requires continual development of the equipment used to process those wafers. Commonly-owned U.S. Pat. No. 8,691,022 describes a process liquid dispenser in a device for treating semiconductor wafers, in which the process liquid is dispensed as a series of monodisperse droplets. Such a process liquid dispenser is advantageous from the standpoint of the reproducibility of the process results, as well as a reduced incidence of undesired damage to the submicroscopic device structures formed on the semiconductor wafer undergoing processing.

It is desirable to monitor the performance of such a dispenser between processes to ensure that the dispenser is exhibiting stable performance, for example, that the stream of droplets retains its monodisperse character, and that the size and frequency of the droplet stream is within an acceptable tolerance.

Conventional techniques for monitoring a series of monodisperse droplets involve assessing the droplet stream optically, for example with a stroboscopic camera system that includes a CCD camera with a microscope lens and an associated strobe to illuminate the droplet stream. Droplets can then be visualized by triggering the stroboscope and the camera simultaneously.

However, the equipment for optical monitoring of a droplet stream is expensive, and moreover requires visual analysis of the photographic images in order to effect any adjustments to the droplet characteristics.

A simpler and more automated technique for monitoring the distribution and/or impulse of a series of droplets could facilitate the implementation of such droplet dispensers in a variety of useful applications.

SUMMARY OF THE INVENTION

Thus, in one aspect, the present invention relates to a device for measuring the distribution and/or impulse of a series of droplets, comprising a piezoelectric sensor that is positioned relative to a source of droplets such that each of a plurality of droplets contacts the piezoelectric sensor in succession, thereby to generate an electrical signal. Logic circuitry of the device is configured to calculate one or more frequencies from the electrical signal.

In preferred embodiments of the device according to the present invention, the logic circuitry is configured to generate an alarm when a frequency calculated from the electrical signal deviates from a target frequency by greater than a predetermined extent.

In preferred embodiments of the device according to the present invention, the logic circuitry is configured to calculate an amplitude associated with each frequency.

In preferred embodiments of the device according to the present invention, the logic circuitry is configured to generate an alarm when an amplitude for a predetermined frequency calculated from the electrical signal deviates from a target amplitude for the predetermined frequency by greater than a predetermined extent.

In preferred embodiments of the device according to the present invention, the piezoelectric sensor comprises a piezoelectric element configured to receive plural series of droplets simultaneously.

In another aspect, the present invention relates to a combination of a source of droplets and a device for measuring the distribution and/or impulse of a series of droplets issuing from the source of droplets. The device comprises a piezoelectric sensor positioned relative to the source of droplets such that each of a plurality of droplets contacts the piezoelectric sensor in succession, thereby to generate an electrical signal. Logic circuitry of the device is configured to calculate one or more frequencies from the electrical signal.

In preferred embodiments of the combination according to the present invention, the logic circuitry is configured to generate an alarm when a frequency or amplitude calculated from the electrical signal deviates from a target frequency or amplitude by greater than a predetermined extent.

In preferred embodiments of the combination according to the present invention, the piezoelectric sensor comprises a piezoelectric element configured to receive plural series of droplets simultaneously.

In preferred embodiments of the combination according to the present invention, the source of droplets is configured to dispense a stream of monodisperse droplets.

In preferred embodiments of the combination according to the present invention, the source of droplets is configured to dispense a stream of monodisperse droplets each having a same diameter within a range of 10-500 nm, at a speed of 10-100 m/s.

In preferred embodiments of the combination according to the present invention, the source of droplets is configured to move between a use range of motion and a rest position, and the piezoelectric sensor is mounted so as to underlie the source of droplets when the source of droplets is in the rest position.

In still another aspect, the present invention relates to an apparatus for wet treatment of wafer-shaped articles, comprising a spin chuck adapted to hold a wafer-shaped article in a predetermined orientation, and a droplet generator configured to dispense liquid through at least one orifice as a spray of monodisperse liquid droplets. The droplet generator is movable between a rest position and a use range of motion. The apparatus also includes a piezoelectric sensor positioned beneath the droplet generator in the rest position, such that each of a plurality of droplets dispensed from the droplet generator in the rest position contacts the piezoelectric sensor in succession, thereby to generate an electrical signal. Logic circuitry is configured to calculate one or more frequencies from the electrical signal.

In preferred embodiments of the apparatus according to the present invention, the logic circuitry is configured to generate an alarm when a frequency or amplitude calculated from the electrical signal deviates from a target frequency or amplitude by greater than a predetermined extent.

In preferred embodiments of the apparatus according to the present invention, the droplet generator is configured to dispense plural series of monodisperse droplets simultaneously.

In yet another aspect, the present invention relates to a method for measuring the distribution and/or impulse of a series of droplets issuing from a source of droplets, comprising positioning a piezoelectric sensor relative to the source of droplets such that each of a plurality of droplets contacts the piezoelectric sensor in succession, thereby to generate an electrical signal; and calculating one or more frequencies from the electrical signal.

In preferred embodiments of the method according to the present invention, an alarm is generated when a frequency and/or amplitude calculated from the electrical signal deviates from a target frequency and/or amplitude by greater than a predetermined extent.

In preferred embodiments of the method according to the present invention, the piezoelectric sensor receives plural series of droplets simultaneously.

In preferred embodiments of the method according to the present invention, the source of droplets dispenses a stream of monodisperse droplets.

In preferred embodiments of the method according to the present invention, the source of droplets dispenses a stream of monodisperse droplets each having a same diameter within a range of 10-500 nm, at a speed of 10-100 m/s.

In preferred embodiments of the method according to the present invention, the source of droplets moves between a use range of motion and a rest position, and wherein the piezoelectric sensor is mounted so as to underlie the source of droplets when the source of droplets is in the rest position.

In preferred embodiments of the method according to the present invention, the source of droplets is a process liquid dispenser in an apparatus for single wafer wet processing of semiconductor wafers, and wherein the piezoelectric sensor is mounted adjacent to a spin chuck for holding and rotating a semiconductor wafer within the apparatus.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION

Figure 1:
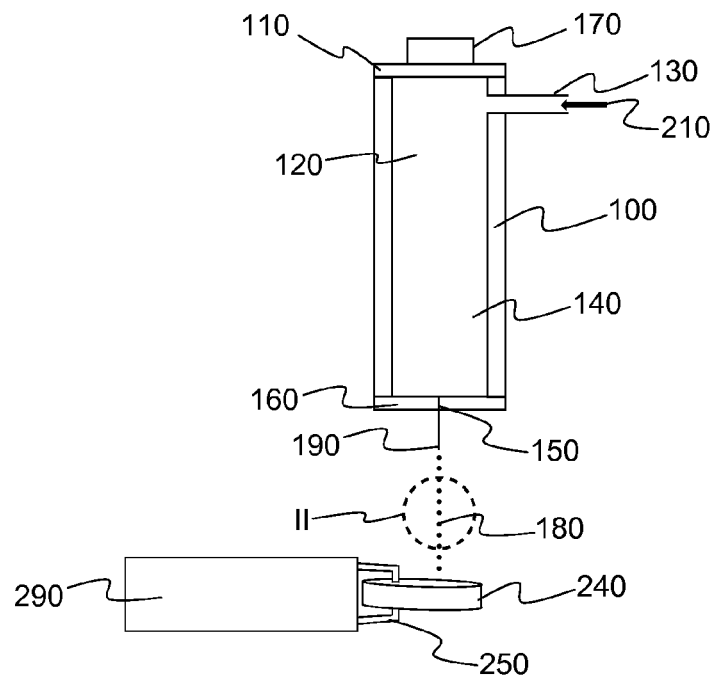
FIG. 1 is a schematic side view of a measuring device according to an embodiment of the present invention, in conjunction with a dispenser that ejects a stream of droplets.

In FIG. 1, a droplet generator is constructed as described in commonly-owned U.S. Pat. No. 8,691,022. The droplet generator includes a body (100) that is supplied with a pressurized process liquid (210) through an inlet (130). The body (100) includes a bottom plate (160) and a top plate (110). The bottom plate (160) contains at least one orifice (150) through which a laminar liquid jet (190) is formed. The top plate (110) is equipped with a transducer (170) (for example a piezoelectric transducer glued to the plate (110) with an epoxy resin). This transducer (170) can be electrically driven at a chosen frequency and power to apply sonic energy (140) with a desired wavelength to the process liquid (120) present in the container (100). Consequently, there will be sonic energy (140) in the process liquid (120) within the orifice (150). This sonic energy (140) will provoke a Rayleigh-Plateau instability in the jet (190), which will in turn lead to the disintegration of the jet (190) into monodisperse droplets (180).

A piezoelectric sensor is positioned so that droplets (180) will impinge on the piezoelectric crystal (240) of the sensor. As will be described in more detail herein, the droplet dispenser is preferably positioned above the piezoelectric sensor when the dispenser has been moved from a use position to a rest position. As the monodisperse droplets (180) impact the piezoelectric crystal (240), the crystal is caused to vibrate and thus generated an electric signal that is transmitted by terminals (250) to processing circuitry with the body (290) of the sensor.

Figure 2:
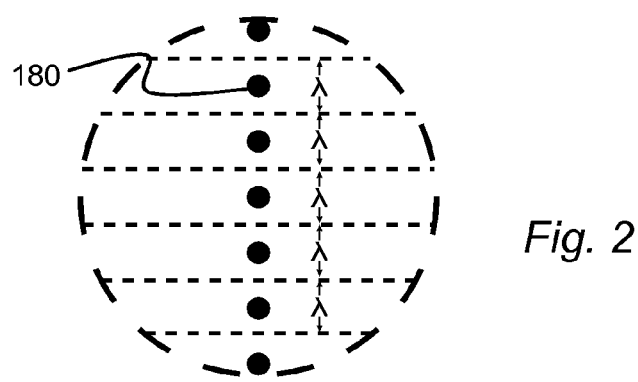
FIG. 2 is an enlargement of the detail II in FIG. 1; cross-sectional view of the droplet generator 2 of FIG. 1.

As shown in FIG. 2, the stream of droplets is composed of monodisperse droplets (180) which are thus of essentially constant diameter when the dispenser is operating correctly. In particular, the droplets (180) are considered to have essentially the same diameter when at least 90 mass % of the droplets (180) have a diameter within a range of +/−5% of a mean diameter of those droplets. When the piezoelectric sensor is positioned reasonably close to the outlet of the droplet dispenser (preferably less than 15 cm, more preferably less than 10 cm), the spacing between consecutive droplets (180) is also essentially constant, and thus the stream of droplets (180) may be characterized by a period $\lambda$ that is likewise essentially constant.

Figure 6:
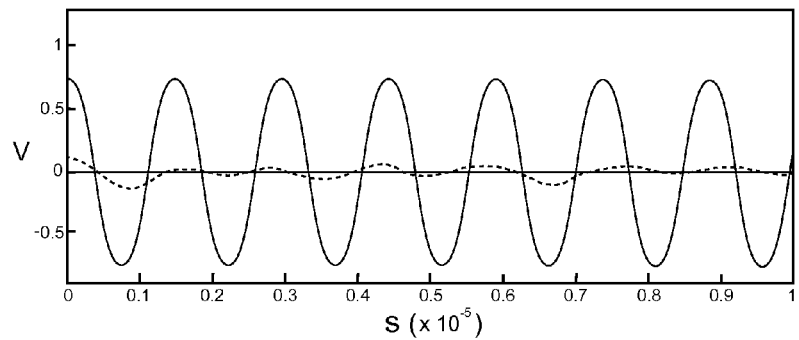
FIG. 6 is a graph showing waveforms generated by a piezoelectric sensor according to an embodiment of the present invention.

Thus, piezoelectric crystal (240) will generate an electrical signal having characteristics of a sine wave of constant frequency and amplitude, as shown in FIG. 6. The broken line waveform in FIG. 6 shows for purposes of comparison the effect of dispensing onto the piezoelectric crystal (240) a stream of polydisperse droplets in which the stream displays a much broader spectrum of frequencies.

To the extent that the signal generated by the piezoelectric sensor deviates from essentially a single frequency, this provides an indication that the droplet generator is drifting away from its specification, and that adjustment might be required. Similarly, if the droplets are monodisperse, then the impulse of the droplets (180) on crystal (240) will not vary, and hence the amplitude of the sine wave signal shown in FIG. 6 should be essentially constant. However, if the amplitude of the signal varies, or differs by more than a predetermined amount from an expected value, then this would also be an indication that the stream of monodisperse droplets may no longer meet the process specifications.

In a typical process using the monodisperse droplet generator of this embodiment, the droplets (180) have a diameter of about 18 μm and are ejected from the outlet (150) of the droplet dispenser at a speed of about 50 m/s. Droplets (180) are thus emitted at a rate of about 12 million droplets per second and impinge on the piezoelectric crystal (240) at a frequency of about 1.2 Mhz.

Figure 7:
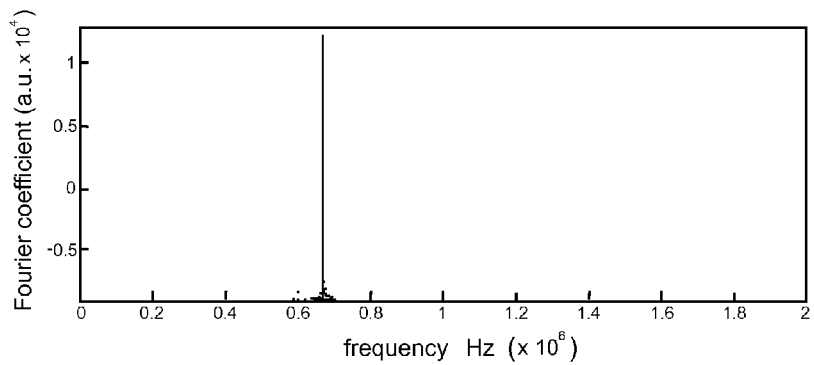
FIG. 7 is a graph showing the result of processing waveforms such as in FIG. 6 with a Fourier transform.

Therefore, the signal whose waveform is shown in FIG. 6 is preferably converted using a Fourier transform in order to generate a frequency signal as shown in FIG. 7. When the droplet dispenser is operating correctly, the Fourier transformed signal will have a value narrowly confined to a single frequency as shown by the solid vertical line in FIG. 7, and the amplitude of that signal will likewise be constant.

The signals illustrated in either or both of FIGS. 6 and 7 may if desired be displayed on a monitor so as to be viewable by an operator of the apparatus in which they are used. Alternatively or in addition, the sensor circuitry may compared the measured signal values to pre-set limits, so as to generate an alarm when the frequency and/or amplitude of the measured signal deviates too greatly from a target value. The scattered dots in FIG. 7 near the base of the tall solid line are the Fourier-transformed signal components of the comparative, variable frequency waveform of FIG. 6.

In practice, preferably the whole spectrum of frequencies is monitored and if a peak is at a different position (higher or lower frequency) or different in height (amplitude), then an alarm is preferably generated. A difference in frequency indicates that the number of droplets per second has changed, whereas a difference in amplitude indicates that the impulse (and energy) of each droplet has changed, which is either due to the mass or velocity of each droplet having changed. A change in the impulse of a droplet can damage the work piece (if the impulse is too high) or result in too little PRE (particle removing efficiency), if the impulse is too low. Both effects (damage and low PRE) have a negative impact on the yield of the produced integrated circuits, which is why the monitoring of the droplets is highly desirable.

Figure 3:
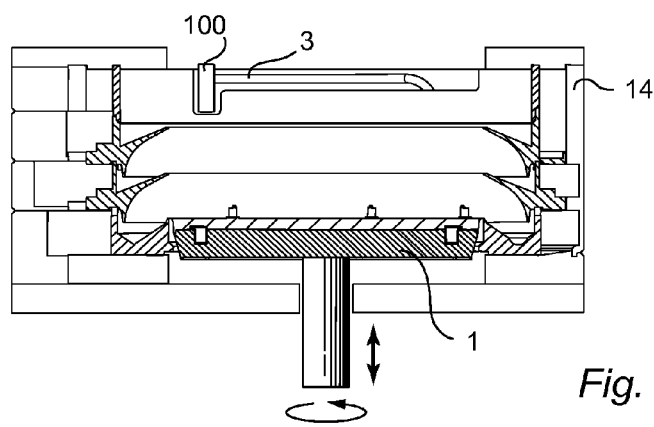
FIG. 3 is a schematic cross-sectional view of an apparatus for processing semiconductor wafers, equipped with a droplet dispenser and measuring device according to an embodiment of the invention.
Figure 4:
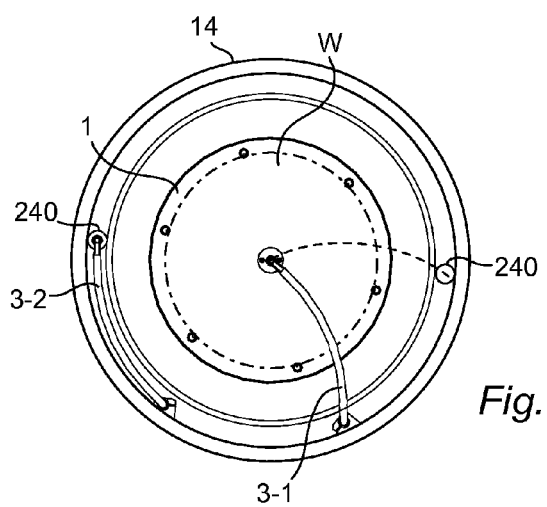
FIG. 4 is a top plan view of the apparatus of FIG. 3.
Figure 5:
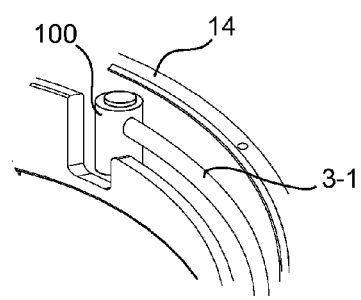
FIG. 5 is a fragmentary perspective view of the apparatus of FIG. 4, showing the droplet dispenser in its rest position.

Turning now to FIGS. 3-5, an apparatus for wet processing of single semiconductor wafers comprises a spin chuck (1) for supporting and rotating a semiconductor wafer W, at least one droplet generator (100), and a support arm (3) on which the droplet generator (100) is mounted. The arm (3) is mounted so that it can move the droplet generator (100) over the spin chuck (1) (and consequently a substrate W), for example along a linear path that is approximately perpendicular to the axis of rotation of the spin chuck (1), or along an arcuate path in a plane that is approximately perpendicular to the axis of rotation of the spin chuck (1). In practice, this movement of the arm (3) and generator (100) is normally effected as the substrate W rotates.

Another liquid dispenser (100) may also included, as shown in FIG. 4. In FIG. 4, the liquid dispenser (100) carried by boom swing arm (3-2) is in its rest position wherein the liquid dispenser (100) overlies the piezoelectric crystal (240) of the associated piezoelectric sensor. On the other hand, the other liquid dispenser (100) carried by boom swing arm (3-1) is in its use position wherein the liquid dispenser (100) overlies the wafer (W). The dashed line arc in FIG. 4 shows the path that this dispenser (100) will take in returning to its rest position.

Preferably, each liquid dispenser (100) is checked each time it returns to its rest position, i.e., before and after each process, by turning on the dispenser (100) for a predetermined time while it is in the rest position, so as to emit a series of droplets that impinges on the piezoelectric crystal (240) of its associated dispenser.

FIG. 5 shows that in the rest position, the liquid dispenser (100) is preferably positioned in an annular region delimited inwardly by a baffle having a cutout to permit passage of the liquid dispenser (100) and outwardly by a surrounding wall (14) of a collector within which the spin chuck (1) is positioned.

Figure 8:
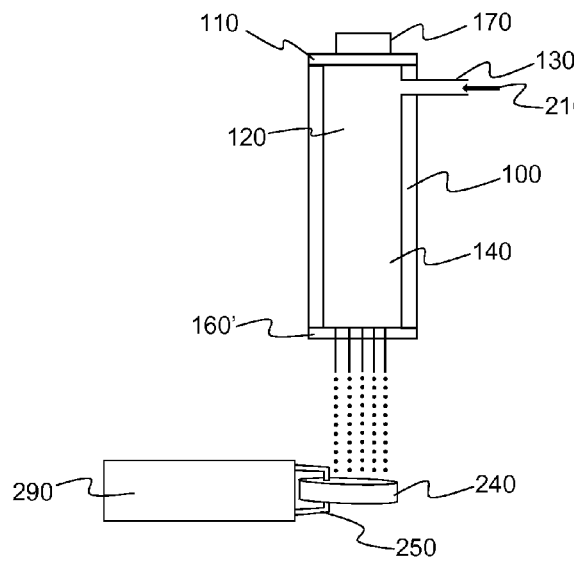
FIG. 8 is a view similar to FIG. 1, of an alternative embodiment according to the present invention.

FIG. 8 shows an alternative embodiment, in which the droplet dispenser ejects plural streams of monodisperse droplets in parallel. In this case, the end plate 160' has five orifices so as to emit five stream of droplets; however, any desired number of streams may be selected by providing a corresponding number of outlet orifices. The number of streams emitted by the dispenser principally affects the amplitude of the signal generated by the piezoelectric sensor, which may thus be utilized in this embodiment as is described for the preceding embodiments.

It will be appreciated from the foregoing description that the present invention permits measuring the distribution and/or impulse of a series of droplets using a fundamentally different measurement technique than the convention optical systems, and, moreover, that the techniques described herein may be implemented using less costly equipment than the conventional techniques and in a manner that facilitates increased automation of the measurement process.

While the present invention has been described in connection with various preferred embodiments thereof, it is to be understood that those embodiments are provided merely to illustrate the invention, and that the invention is not limited to those embodiments, but rather includes that which is encompassed by the true scope and spirit of the appended claims.

What is claimed is:

1. An apparatus for wet treatment of wafer-shaped articles, comprising:
    a spin chuck adapted to hold a wafer-shaped article in a predetermined orientation;
    a droplet generator configured to dispense liquid through at least one orifice as a spray of monodisperse liquid droplets, the droplet generator being movable between a rest position and a use range of motion;
    a piezoelectric sensor positioned beneath the droplet generator in said rest position, such that each of a plurality of said droplets dispensed from the droplet generator in the rest position contacts said piezoelectric sensor in succession, thereby to generate an electrical signal; and
    logic circuitry configured to calculate one or more frequencies and/or amplitudes for one or more predetermined frequencies from said electrical signal.

2. The apparatus according to claim 1, wherein said logic circuitry is configured to generate an alarm when at least one of:
    a frequency calculated from said electrical signal deviates from a target frequency by greater than a first predetermined amount; and
    an amplitude calculated from said electrical signal deviates from a target amplitude by greater than a second predetermined amount.

3. The apparatus according to claim 1, wherein said droplet generator is configured to dispense plural series of monodisperse liquid droplets simultaneously.

* * * * *